(12) United States Patent
Yao et al.

(10) Patent No.: US 12,356,567 B2
(45) Date of Patent: Jul. 8, 2025

(54) SAFETY LOCK REMOVABLE MECHANISM

(71) Applicant: DELL PRODUCTS L.P., Round Rock, TX (US)

(72) Inventors: Chung-Han Yao, Shilin District (TW); Tung Yu Chien, Zhonhe District (TW); Shih-Hsuan Hu, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 189 days.

(21) Appl. No.: 18/323,840

(22) Filed: May 25, 2023

(65) Prior Publication Data

US 2024/0397648 A1 Nov. 28, 2024

(51) Int. Cl.
*H05K 5/02* (2006.01)

(52) U.S. Cl.
CPC .......... *H05K 5/0221* (2013.01); *H05K 5/023* (2013.01); *H05K 5/0286* (2013.01)

(58) Field of Classification Search
None
See application file for complete search history.

(56) References Cited

U.S. PATENT DOCUMENTS

| | | | |
|---|---|---|---|
| 5,641,296 A * | 6/1997 | Larabell | H01R 13/62933 |
| 6,456,501 B1 * | 9/2002 | Rubenstein | G11B 33/128 |
| | | | 361/801 |
| 9,258,913 B2 | 2/2016 | Terwilliger et al. | |
| 10,168,747 B2 * | 1/2019 | Zhu | H05K 7/1489 |
| 10,251,300 B1 * | 4/2019 | Mao | H05K 7/1487 |
| 10,264,698 B2 * | 4/2019 | Kho | H05K 7/1492 |
| 10,564,685 B2 * | 2/2020 | Chen | G06F 1/185 |
| 10,863,644 B1 * | 12/2020 | Tseng | H05K 7/1487 |
| 2015/0070858 A1 * | 3/2015 | Wu | H05K 7/1417 |
| | | | 361/807 |
| 2015/0103492 A1 * | 4/2015 | Wu | H05K 7/1431 |
| | | | 361/726 |
| 2017/0150634 A1 * | 5/2017 | Huang | H05K 7/1489 |
| 2017/0339799 A1 * | 11/2017 | Su | H05K 7/1489 |
| 2018/0228049 A1 * | 8/2018 | Liao | A47B 88/477 |
| 2020/0267869 A1 | 8/2020 | Hung et al. | |
| 2021/0011529 A1 * | 1/2021 | Escamilla | G06F 1/186 |

* cited by examiner

*Primary Examiner* — Xanthia C Relford
(74) *Attorney, Agent, or Firm* — Larson Newman, LLP (57) ABSTRACT

A module sled of an information handling system includes a main portion and a handle. The main portion includes frame components of the module sled. The handle is in physical communication with the main portion and includes a grip portion and a latch portion. The latch portion is in physical communication with the grip portion. The latch portion is located between the grip portion and the main portion of the module sled. The latch portion is biased toward a locked position to hold the module sled within the information handling system.

18 Claims, 5 Drawing Sheets

SAFETY LOCK REMOVABLE MECHANISM

FIELD OF THE DISCLOSURE

The present disclosure generally relates to information handling systems, and more particularly relates to a safety lock removable mechanism.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A module sled of an information handling system includes a main portion and a handle. The main portion includes frame components of the module sled. The handle is in physical communication with the main portion and includes a grip portion and a latch portion. The latch portion is in physical communication with the grip portion. The latch portion is located between the grip portion and the main portion of the module sled. The latch portion may be biased toward a locked position to hold the module sled within the information handling system.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
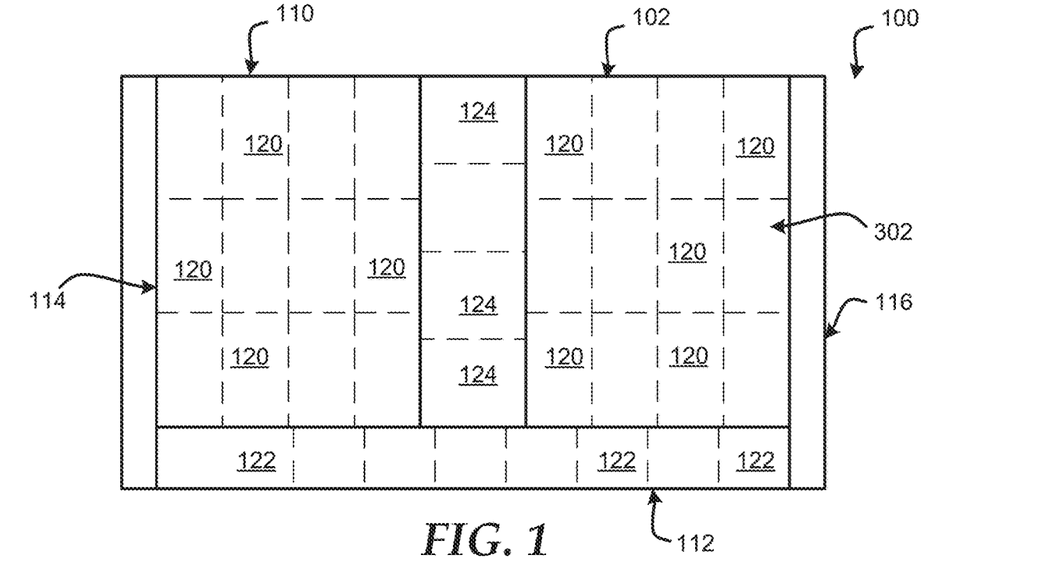
FIG. 1 is a block diagram of a front panel of an information handling system according to at least one embodiment of the present disclosure.

FIG. 1 illustrates an information handling system 100 according to at least one embodiment of the present disclosure. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), server (such as a blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Information handling system 100 includes a chassis 102, which in turn includes a top panel 110, a bottom panel 112, and side panels 114 and 116. The components and devices located within a front portion of chassis 100 include multiple compute devices 120, power supply units 122, and fans 124. In an embodiment, compute devices 120 can be peripheral devices, such as storage devices, peripheral component interconnect express (PCIe) devices, or the like. In an embodiment, compute devices 120 may utilize most of the space of the front of chassis 102 except where power supply units 122 extend horizontally across the bottom of the chassis adjacent to bottom panel 112, and fans 124 extend vertically down the center of the chassis from the top panel 110 to the top of power supply units 122.

Figure 2:
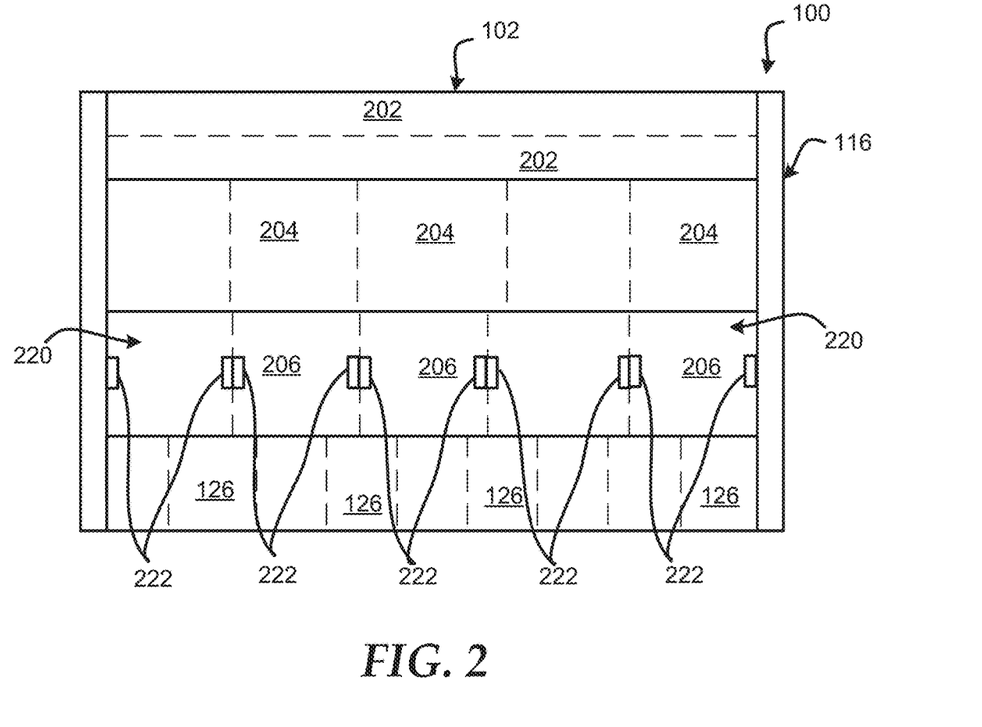
FIG. 2 is a block diagram of a rear panel of the information handling system according to at least one embodiment of the present disclosure.

Referring to FIG. 2, the components and devices located within the back of chassis 102 include multiple I/O devices 202, a first group of fans 204, and multiple other modules 206. In an embodiment, I/O devices 202 may be oriented horizontally across the top of back panel 116. Fans 124 can be located in a horizontal row below I/O devices 104 within back panel 116, and modules 206 may be located in a horizontal row below fans 124 within the back panel. In an embodiment, each power supply unit 122 includes a fan within the power supply unit itself. In this embodiment, back panel 116 may include exhaust ports 208 to expel air from fans of power supply units 122. In another embodiment, fans within power supply units 122 may be moved to exhaust ports 208 without varying from the scope of the disclosure. Information handling system 100 may include any suitable number of additional components or information handling systems without varying from the scope of this disclosure.

In an example, each module 206 may be any suitable compute module including, but not limited to, a graphics processing unit (GPU) module and a processing module. Module 206 may include any suitable components including, but not limited to, the components of FIG. 8. In certain examples, each module 206 may be inserted within a different slot 220 of information handling system 100. Each slot 220 includes sled mounting rails 222. In an example, a module 206 may be inserted into or removed from a corresponding slot 220 by sliding along sled mounting rails 222 within the slot.

Figure 3:
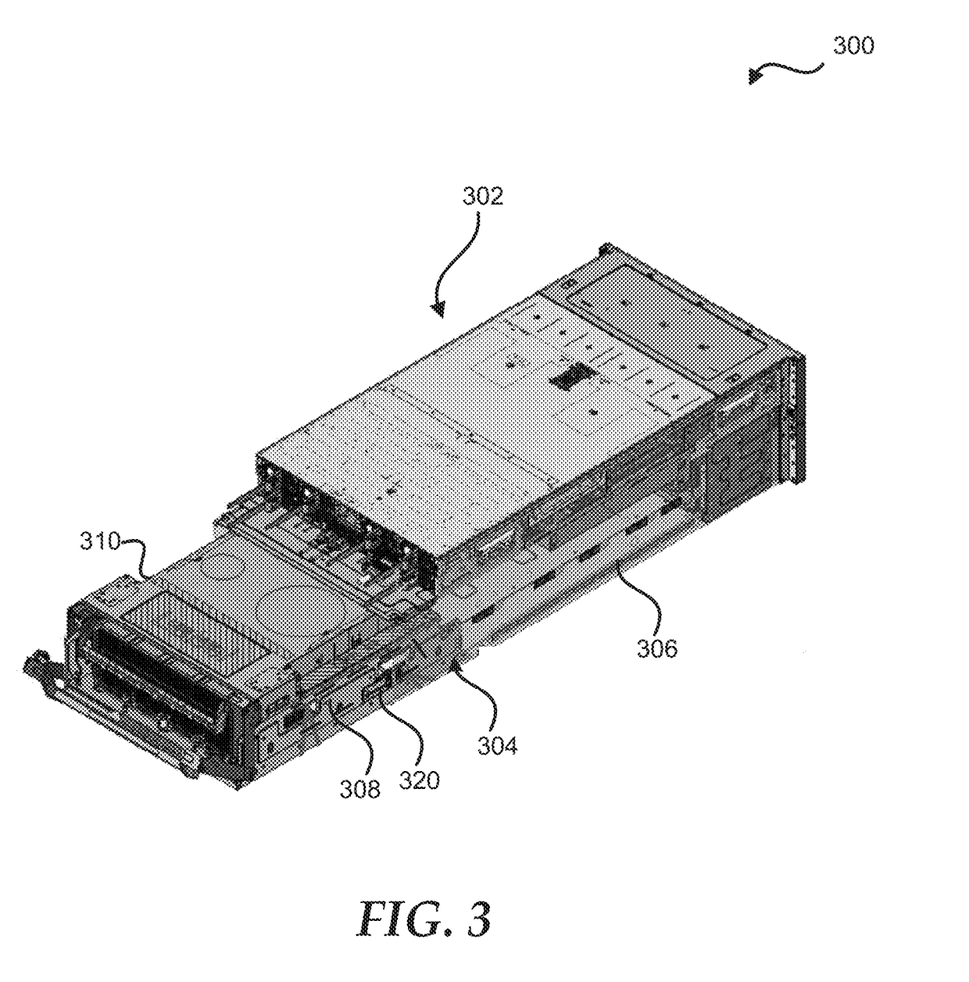
FIG. 3 is a diagram of a module and a module sled of an information handling system according to at least one embodiment of the present disclosure.

FIG. 3 illustrates a system 300 including a module 302 in physical communication with a module sled 304. In an example, module sled 304 may support module 302 and enable the module to slide along sled mounting rails 222 within slot 220 of information handling system 100 of FIG. 2. Module sled 304 includes a main portion 306 and handles 308 and 310. In an example, main portion 306 is in physical communication with a bottom surface of module 302. For example, main portion 306 may be in physical communication with a bottom surface of module 302, portions of side surfaces of the module. In certain examples, main portion 306 may provide a support tray for module 302.

In an example, handles 308 and 310 may extend upward from main portion 306 of module sled 304. Handles 308 and 310 include a grip portion for an individual associated with module 302 to exert a force on the module to hold and support the module while the module is removed from an information handling system, such as information handling system 100 of FIGS. 1 and 2. In an example, each of handles 308 and 310 may include a separate latch to lock and unlock the module sled 304 and module 302 from an information handling system as will be described with respect to FIGS. 4-7 below. While handles 308 and 310 may be substantially similar, the description of the handles will be described with respect to a portion of handle 308 illustrated within box 320.

FIGS. 4-7 illustrate a portion 400 of a module sled including a main portion 404 and a handle 408. Handle 408 includes a grip portion 410, a latch 412, an opening 414, a pin 416, and a spring 418. Grip portion 410 includes a recess portion 420, which in turn includes ends 422 and 424, and a tab 426. Latch 412 includes ends 430 and 432, a middle portion 434, and a hook 436. Hook 436 includes a ramp portion 438 and a catch portion 440. In an example, hook 436 may be secured to end 430 of latch 412. Pin 416 is in physical communication with one end of tab 426, and the other end of tab 426 is in physical communication with recess portion 420.

In an example, tab 426 extends substantially perpendicularly from recess portion 420, such that pin 416 is connected to the end of the tab that is distal, or furthest, from the recess portion. In an example, pin 416 may extend in a perpendicular direction away from tab 426. Spring 418 is in physical communication with pin 416, with tab 426, and middle portion 434 of latch 412. In certain examples, spring 418 may exert a force on middle portion 434 of latch 412 to bias the latch towards a locked position as illustrated in FIGS. 4 and 5.

Figure 4:
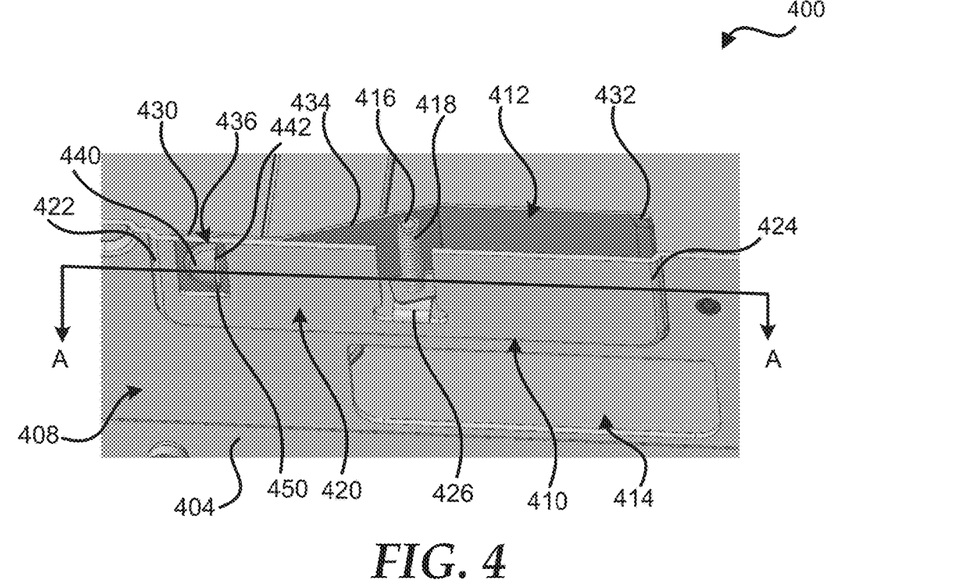
FIGS. 4 and 5 are diagrams of a portion of a module sled with a latch in a locked position according to at least one embodiment of the present disclosure.
Figure 5:
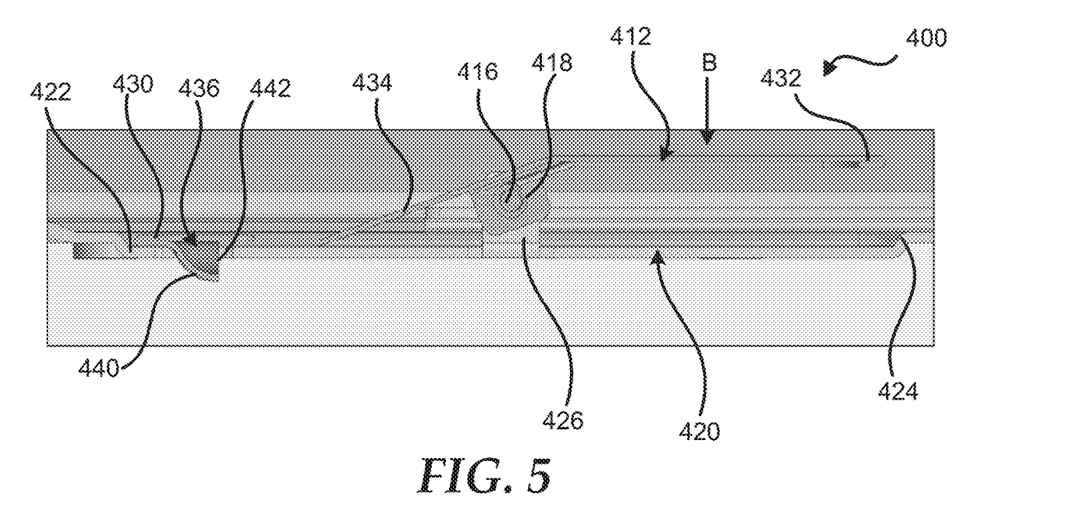

Referring now to FIGS. 4 and 5, latch 412 is illustrated in a locked position. FIG. 5 illustrates a cross section of handle 408 along line A-A of FIG. 4. While latch 412 is in the locked position, end 430 of the latch is in physical communication with end 422 of recess portion 420 and hook 436 extends through an opening 450 of the recess portion. Additionally, while latch 412 is in the locked position, end 432 of the latch is not in physical communication with end 424 of recess portion 420, such that there is a gap or space between end 432 of the latch and end 424 of the recess portion.

In an example, as a module and a module sled in physical communication with the module are inserted within a chassis of an information handling system, such as module 302 and 304 being inserted within chassis 102 of information handling system 100 of FIGS. 1 and 2, a portion of the chassis may exert a force on ramp portion 438 of hook 436. In certain examples, the force exerted on ramp portion 438 may be greater than the force exerted on middle portion 434 of latch 412 by spring 418. Based on the force exerted on ramp portion 438 exceeding the force of spring 418, hook 436 may be pushed out of opening 450 and latch 412 may transition from the locked position to an unlocked position. While latch 412 is in the unlocked position, module sled 304 may be inserted within a chassis of an information handling system.

In certain examples, when module 302 and module sled 304 of FIG. 3 are fully inserted within a chassis, such as chassis 102 of FIG. 1, the force exerted on hook 436 may be removed, such that the force from spring 418 may cause latch 412 to transition from the unlocked position to the locked position. Based on latch 412 being in the locked position, hook 436 may extend through opening 450 and snap fit within a notch of the chassis. In an example, catch portion 442 of hook 436 may be in physical communication with the notch of the chassis, and this physical communication may secure both a module sled and a corresponding module within a chassis, such as module 302 and module sled 304 of FIG. 3 within chassis 102 of FIGS. 1 and 2.

In an example, an individual associated with an information handling system, such as information handling system 100 of FIGS. 1 and 2, may utilize handle 408 to remove a module sled and an associated module, such as module sled 302 and module 302 of FIG. 3. In certain examples, an individual may insert his/her hand within opening 414 with the palm of the hand facing latch 412. Based on the palm of the hand facing latch 412, the palm of the hand may be placed in physical communication with a top surface of opening 414 to exert a force on handle 408. The force exerted upward on handle 408 may support a module sled and module while these components are removed from within a chassis of an information handling system.

During the removal of a module sled from within a chassis, a force may be exerted on end 432 of latch 412 in the direction of arrow B in FIG. 5. In certain examples, the force in the direction of arrow B may be exerted by any suitable manner including, but not limited to, the fingers of the individual associated with the information handling system. In an example, the force in the direction of arrow B may be greater than the force from spring 418, such that the gap/space between end 432 of latch 412 and end 424 of recess portion 420 may reduce. In certain examples, latch 412 may pivot around pin 416 such that end 430 of the latch is no longer in physical communication with end 422 of recess portion 420. Based on the rotation of latch 412 around pin 416, the latch may transition from the lock position to an unlocked position.

Figure 6:
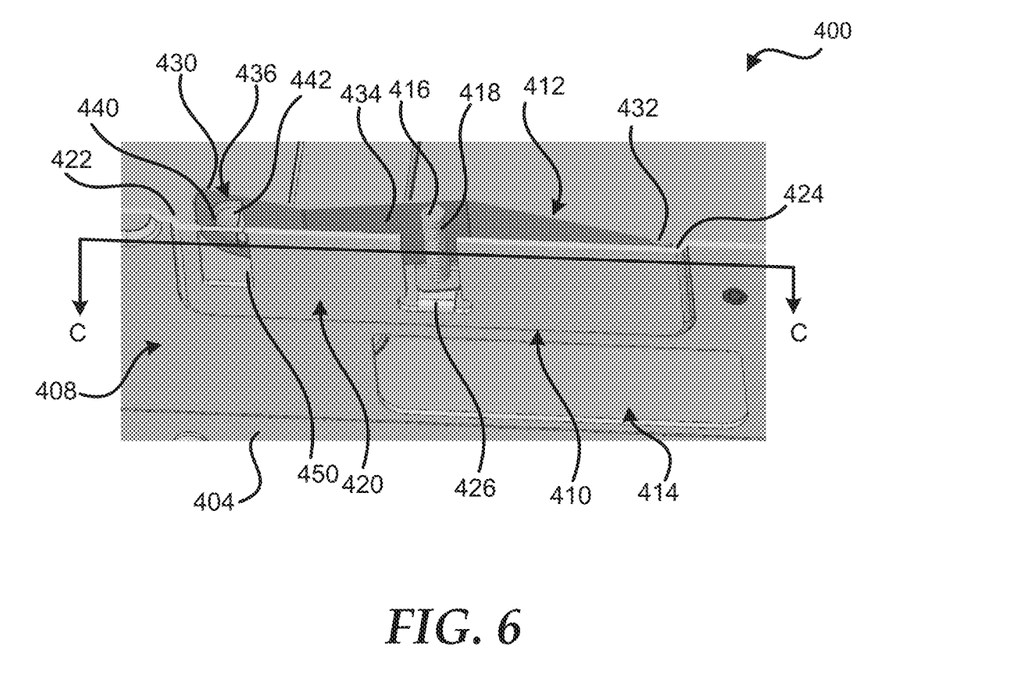
FIGS. 6 and 7 are diagrams of a portion of a module sled with a latch in an unlocked position according to at least one embodiment of the present disclosure.
Figure 7:
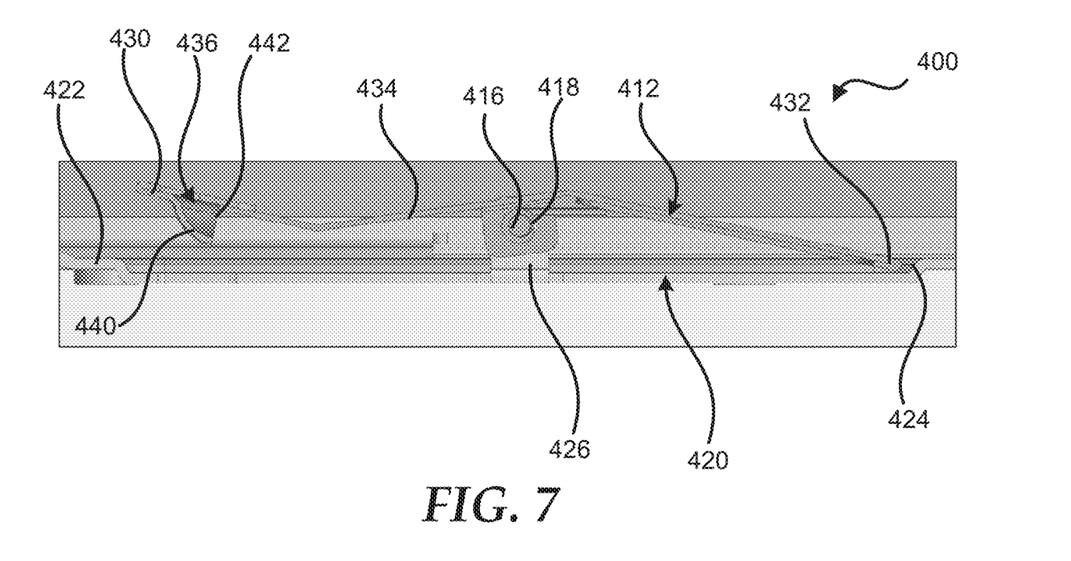

Referring now to FIGS. 6 and 7, latch 412 is illustrated in an unlocked position. FIG. 7 illustrates a cross section of handle 408 along line C-C of FIG. 6. While latch 412 is in the unlocked position, end 432 of the latch is in physical communication with end 424 of recess portion 420 and hook 436 may be no longer within opening 450 of the recess portion. Additionally, while latch 412 is in the unlocked position, end 430 of the latch is not in physical communication with end 422 of recess portion 420, such that there is a gap or space between end 430 of the latch and end 422 of the recess portion.

In an example, as a module and a module sled in physical communication with the module are removed from within a chassis of an information handling system, such as module 302 and 304 being removed from within chassis 102 of information handling system 100 of FIGS. 1 and 2, a force exerted on end 432 of latch 412 may hold the latch in the unlocked position. Based on the force exerted on end 432 exceeding the force of spring 418, hook 436 may be pulled out of opening 450 and latch 412 may transition from the locked position to the unlocked position. While latch 412 is in the unlocked position, module sled 304 may be removed from within a chassis of an information handling system.

In certain examples, when module 302 and module sled 304 of FIG. 3 are fully removed from a chassis, such as chassis 102 of FIG. 1, the force exerted on end 432 of latch 412 may be removed, such that the force from spring 418 may cause the latch to transition from the unlocked position to the locked position. Based on latch 412 being in the locked position, hook 436 may extend through opening 450.

Figure 8:
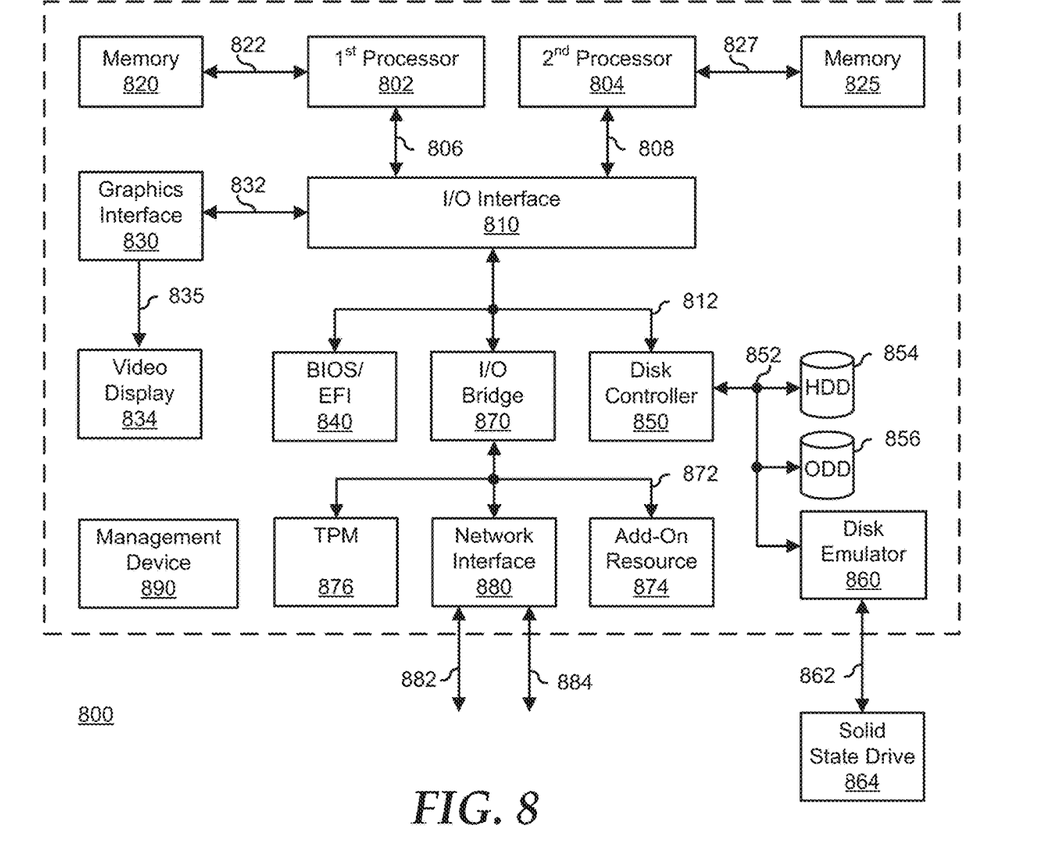
FIG. 8 is a block diagram of a general information handling system according to an embodiment of the present disclosure.

FIG. 8 shows a generalized embodiment of an information handling system 800 according to an embodiment of the present disclosure. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 800 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 800 can include processing resources for executing machine-executable code, such as a central processing unit (CPU), a programmable logic array (PLA), an embedded device such as a System-on-a-Chip (SoC), or other control logic hardware. Information handling system 800 can also include one or more computer-readable medium for storing machine-executable code, such as software or data. Additional components of information handling system 800 can include one or more storage devices that can store machine-executable code, one or more communications ports for communicating with external devices, and various input and output (I/O) devices, such as a keyboard, a mouse, and a video display. Information handling system 800 can also include one or more buses operable to transmit information between the various hardware components.

Information handling system 800 can include devices or modules that embody one or more of the devices or modules described below and operates to perform one or more of the methods described below. Information handling system 800 includes a processors 802 and 804, an input/output (I/O) interface 810, memories 820 and 825, a graphics interface 830, a basic input and output system/universal extensible firmware interface (BIOS/UEFI) module 840, a disk controller 850, a hard disk drive (HDD) 854, an optical disk drive (ODD) 856, a disk emulator 860 connected to an external solid state drive (SSD) 862, an I/O bridge 870, one or more add-on resources 874, a trusted platform module (TPM) 876, a network interface 880, a management device 890, and a power supply 895. Processors 802 and 804, I/O interface 810, memory 820, graphics interface 830, BIOS/UEFI module 840, disk controller 850, HDD 854, ODD 856, disk emulator 860, SSD 862, I/O bridge 870, add-on resources 874, TPM 876, and network interface 880 operate together to provide a host environment of information handling system 800 that operates to provide the data processing functionality of the information handling system. The host environment operates to execute machine-executable code, including platform BIOS/UEFI code, device firmware, operating system code, applications, programs, and the like, to perform the data processing tasks associated with information handling system 800.

In the host environment, processor 802 is connected to I/O interface 810 via processor interface 806, and processor 804 is connected to the I/O interface via processor interface 808. Memory 820 is connected to processor 802 via a memory interface 822. Memory 825 is connected to processor 804 via a memory interface 827. Graphics interface 830 is connected to I/O interface 810 via a graphics interface 832 and provides a video display output 836 to a video display 834. In a particular embodiment, information handling system 800 includes separate memories that are dedicated to each of processors 802 and 804 via separate memory interfaces. An example of memories 820 and 830 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 840, disk controller 850, and I/O bridge 870 are connected to I/O interface 810 via an I/O channel 812. An example of I/O channel 812 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 810 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 840 includes BIOS/UEFI code operable to detect resources within information handling system 800, to provide drivers for the resources, initialize the resources, and access the resources. BIOS/UEFI module 840 includes code that operates to detect resources within information handling system 800, to provide drivers for the resources, to initialize the resources, and to access the resources.

Disk controller 850 includes a disk interface 852 that connects the disk controller to HDD 854, to ODD 856, and to disk emulator 860. An example of disk interface 852 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 860 permits SSD 864 to be connected to information handling system 800 via an external interface 862. An example of external interface 862 includes a USB interface, an IEEE 8394 (Firewire) interface, a proprietary interface, or a combination thereof. Alternatively, solid-state drive 864 can be disposed within information handling system 800.

I/O bridge 870 includes a peripheral interface 872 that connects the I/O bridge to add-on resource 874, to TPM 876, and to network interface 880. Peripheral interface 872 can be the same type of interface as I/O channel 812 or can be a different type of interface. As such, I/O bridge 870 extends the capacity of I/O channel 812 when peripheral interface 872 and the I/O channel are of the same type, and the I/O bridge translates information from a format suitable to the I/O channel to a format suitable to the peripheral channel 872 when they are of a different type. Add-on resource 874 can include a data storage system, an additional graphics interface, a network interface card (NIC), a sound/video processing card, another add-on resource, or a combination thereof. Add-on resource 874 can be on a main circuit board, on separate circuit board or add-in card disposed within information handling system 800, a device that is external to the information handling system, or a combination thereof.

Network interface 880 represents a NIC disposed within information handling system 800, on a main circuit board of the information handling system, integrated onto another component such as I/O interface 810, in another suitable location, or a combination thereof. Network interface device 880 includes network channels 882 and 884 that provide interfaces to devices that are external to information handling system 800. In a particular embodiment, network channels 882 and 884 are of a different type than peripheral channel 872 and network interface 880 translates information from a format suitable to the peripheral channel to a format suitable to external devices. An example of network channels 882 and 884 includes InfiniBand channels, Fibre Channel channels, Gigabit Ethernet channels, proprietary channel architectures, or a combination thereof. Network channels 882 and 884 can be connected to external network resources (not illustrated). The network resource can include another information handling system, a data storage system, another network, a grid management system, another suitable resource, or a combination thereof.

Management device 890 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 800. In particular, management device 890 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 800, such as system cooling fans and power supplies. Management device 890 can include a network connection to an external management system, and the management device can communicate with the management system to report status information for information handling system 800, to receive BIOS/UEFI or system firmware updates, or to perform other task for managing and controlling the operation of information handling system 800.

Management device 890 can operate off of a separate power plane from the components of the host environment so that the management device receives power to manage information handling system 800 when the information handling system is otherwise shut down. An example of management device 890 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 890 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A module sled of an information handling system, the module sled comprising:
   a main portion including frame components; and
   a handle in physical communication with the main portion, the handle including:
   a grip portion;
   a latch portion in physical communication with the grip portion, wherein the latch portion is located between the grip portion and the main portion, wherein the latch portion is biased toward a locked position to hold the module sled within the information handling system; and
   a recess portion within the grip portion, the recess portion includes a first end and a second end, wherein the first end of the recess portion is in physical communication with a first end of the latch portion when the latch portion is in the locked position.

2. The module sled of claim 1, wherein the second end of the latch portion is in physical communication with the second end of the recess portion when the latch portion is in an unlocked position.

3. The module sled of claim 1, wherein the latch portion includes a hook on the first end of the latch portion, wherein the hook is placed in physical communication with the information handling system to secure the module sled within the information handling system.

4. The module sled of claim 3, wherein the hook extends through the recess portion to be placed in physical communication with the information handling system when the latch portion is in the locked position.

5. The module sled of claim 1, wherein the grip portion further includes: a tab including a first end and a second end, wherein the first end of the tab is in physical communication with the recess portion, the tab extends perpendicular to the grip portion and the second end is a distal end from the recess portion.

6. The module sled of claim 5, wherein the handle further includes: a pin extending from the second end of tab, wherein the pin is a pivot point for the latch portion.

7. The module sled of claim 6, wherein the handle further includes: a spring in physical communication with the pin, wherein the spring exerts a force on the latch portion to bias the latch portion toward the locked portion.

8. An information handling system comprising:
a sled mounting rail;
a module including one or more processing components; and
a module sled in physical communication with the module and the sled mounting rail, the module sled including:
  a main portion including frame components of the module sled; and
  a handle in physical communication with the main portion, the handle including:
    a grip portion;
    a latch portion in physical communication with the grip portion, wherein the latch portion is located between the grip portion and the main portion, wherein the latch portion is biased toward a locked position to secure the module sled to the sled mounting rail and hold the module sled and the module within the information handling system; and
    a recess portion within the grip portion, the recess portion includes a first end and a second end, wherein the first end of the recess portion is in physical communication with a first end of the latch portion when the latch portion is in the locked position.

9. The information handling system of claim 8, wherein the second end of the latch portion is in physical communication with the second end of the recess portion when the latch portion is in an unlocked position.

10. The information handling system of claim 8, wherein the latch portion includes a hook on the first end of the latch portion, wherein the hook is placed in physical communication with the information handling system to secure the module sled within the information handling system.

11. The information handling system of claim 10, wherein the hook extends through the recess portion to be placed in physical communication with the information handling system when the latch portion is in the locked position.

12. The information handling system of claim 8, wherein the grip portion further includes: a tab including a first end and a second end, wherein the first end of the tab is in physical communication with the recess portion, the tab extends perpendicular to the grip portion and the second end is a distal end from the recess portion.

13. The information handling system of claim 12, wherein the handle further includes: a pin extending from the second end of tab, wherein the pin is a pivot point for the latch portion.

14. The information handling system of claim 13, wherein the handle further includes: a spring in physical communication with the pin, wherein the spring exerts a force on the latch portion to bias the latch portion toward the locked portion.

15. An information handling system comprising:
a sled mounting rail;
a module including one or more processing components; and
a module sled in physical communication with the module and the sled mounting rail, the module sled including:
  a main portion including frame components of the module sled; and
  a handle in physical communication with the main portion, the handle including:
    a grip portion to provide support to the main portion when the module sled is removed from the information handling system, the grip portion including a recess portion having a first end and a second end, wherein the first end of the recess portion is in physical communication with a first end of the latch portion when the latch portion is in the locked position;
    a latch portion in physical communication with the grip portion, wherein the latch portion is located between the grip portion and the main portion, and the latch portion is biased toward a locked position to secure the module sled to the sled mounting rail and hold the module sled and the module within the information handling system; and
    a pin in physical communication with the recess portion, wherein the pin is a pivot point for the latch portion.

16. The information handling system of claim 15, wherein the second end of the latch portion is in physical communication with the second end of the recess portion when the latch portion is in an unlocked position.

17. The information handling system of claim 15, wherein the latch portion includes a hook on the first end of the latch portion, wherein the hook is placed in physical communication with the information handling system to secure the module sled within the information handling system.

18. The information handling system of claim 17, wherein the hook extends through the recess portion to be placed in physical communication with the information handling system when the latch portion is in the locked position.

\* \* \* \* \*